US009362277B2

(12) United States Patent
Chi et al.

(10) Patent No.: US 9,362,277 B2
(45) Date of Patent: Jun. 7, 2016

(54) FINFET WITH MULTILAYER FINS FOR MULTI-VALUE LOGIC (MVL) APPLICATIONS AND METHOD OF FORMING (71) Applicant: GLOBALFOUNDRIES Inc., Grand Cayman (KY)

(72) Inventors: Min-hwa Chi, Malta, NY (US); Ajey Jacob, Albany, NY (US); Abhijeet Paul, Guilderland, NY (US)

(73) Assignee: GLOBALFOUNRIES INC., Grand Cayman (KY)

( * ) Notice: Subject to any disclaimer, the term of this patent is extended or adjusted under 35 U.S.C. 154(b) by 317 days.

(21) Appl. No.: 14/175,827

(22) Filed: Feb. 7, 2014

(65) Prior Publication Data

US 2015/0228648 A1   Aug. 13, 2015

(51) Int. Cl.
*H01L 21/8238* (2006.01)
*H01L 21/205* (2006.01)
(Continued)

(52) U.S. Cl.
CPC ........ *H01L 27/0886* (2013.01); *H01L 21/0262* (2013.01); *H01L 21/02532* (2013.01); *H01L 21/02639* (2013.01); *H01L 21/308* (2013.01); *H01L 21/3065* (2013.01); *H01L 21/30625* (2013.01); *H01L 21/823431* (2013.01); *H01L 21/823481* (2013.01); *H01L 29/161* (2013.01); *H01L 21/02529* (2013.01); *H01L 21/02576* (2013.01); *H01L 21/02579* (2013.01)

(58) Field of Classification Search
CPC .............. H01L 21/02532; H01L 21/02576; H01L 21/02579; H01L 21/823431; H01L 27/0086
See application file for complete search history.

(56) References Cited

U.S. PATENT DOCUMENTS 6,995,396 B2 * 2/2006 Takahashi ............... C30B 25/02
257/280
7,405,142 B2 * 7/2008 Shiono ............... H01L 21/02381
257/E21.129

(Continued)

FOREIGN PATENT DOCUMENTS

| JP | 2011527103 A | 10/2011 |
| TW | 201220406 A1 | 5/2012 |
| TW | 201344805 A | 11/2013 |

OTHER PUBLICATIONS

T. King et al., "Electrical Properties of Heavily Doped Polycrystalline Silicon—Germanium Films," IEEE Transactions on Electron Devices, vol. 41, No. 2, Feb. 1994, pp. 228-232.

(Continued)

*Primary Examiner* — Thao X Le
*Assistant Examiner* — J. R. Oakley
(74) *Attorney, Agent, or Firm* — Ditthavong & Steiner, P.C.

(57) ABSTRACT

A method of forming a multi-valued logic transistor with a small footprint and the resulting device are disclosed. Embodiments include forming plural fins on a silicon substrate, each fin covered with a hardmask; filling spaces between the fins and hard masks with an oxide; removing the hardmasks and recessing each fin, forming a cavity in the oxide over each fin; forming plural Si-based layers in each cavity with an increasing percentage of Ge or C or with an decreasing concentration of dopant from a bottom layer to a top layer; performing CMP for planarization to a top of the fins; recessing the oxide to a depth slightly below a top portion of the fin having a thickness equal to a thickness of each Si-based layer; and forming a high-k gate dielectric and a metal gate electrode over the plural Si-based layers.

12 Claims, 6 Drawing Sheets (51) Int. Cl.
  *H01L 27/088*     (2006.01)
  *H01L 21/8234*    (2006.01)
  *H01L 29/161*     (2006.01)
  *H01L 21/02*      (2006.01)
  *H01L 21/306*     (2006.01)
  *H01L 21/3065*    (2006.01)
  *H01L 21/308*     (2006.01)

(56) References Cited

U.S. PATENT DOCUMENTS

| | | | |
|---|---|---|---|
| 2009/0309152 A1* | 12/2009 | Knoefler | H01L 21/28273 257/324 |
| 2013/0161756 A1* | 6/2013 | Glass | H01L 29/66545 257/369 |
| 2013/0257790 A1 | 10/2013 | Chen et al. | |
| 2013/0277746 A1 | 10/2013 | Baldauf et al. | |

OTHER PUBLICATIONS

P-E. Hellberg et al., "Work Function of Boron-Doped Polycrystalline $Si_xGe_{1-x}$ Films," IEEE Electron Device Letters, vol. 18, No. 9, Sep. 1997, pp. 456-458.

D.V. Singh, "Measurement of the Conduction Band Offsets in $Si/Si_{1-x-y}Ge_xC_y$ and $Si/Si_{1-y}C_y$ Heterostructures Using Metal-Oxide-Semiconductor Capacitors," Journal of Applied Physics, vol. 85, No. 2, Jan. 15, 1999, pp. 978-984.

D.V. Singh, "Admittance Spectroscopy Anaylsis of the Conduction Band Offsets in $Si/Si_{1-x-y}Ge_xC_y$ and $Si/Si_{1-y}C_y$ Heterostructures," Journal of Applied Physics, vol. 85, No. 2, Jan. 15, 1999, pp. 985-993.

P. Lablans "N-state switching" at "www.multivaluedlogic.com", 2013, pp. 1-14.

Taiwanese Office Action for related Taiwanese Patent Application No. 103136587 dated Feb. 24, 2016, 7 Pages.

\* cited by examiner

FIG. 1A
BACKGROUND

FIG. 1B
BACKGROUND

FIG. 1C
BACKGROUND

FINFET WITH MULTILAYER FINS FOR MULTI-VALUE LOGIC (MVL) APPLICATIONS AND METHOD OF FORMING

TECHNICAL FIELD

The present disclosure relates to multi-valued logic (MVL) transistors. The present disclosure is particularly applicable to 14 nanometer (nm)—extreme mobility (14XM) and 10 nm FinFET technology nodes and beyond.

BACKGROUND

Figure 1A:
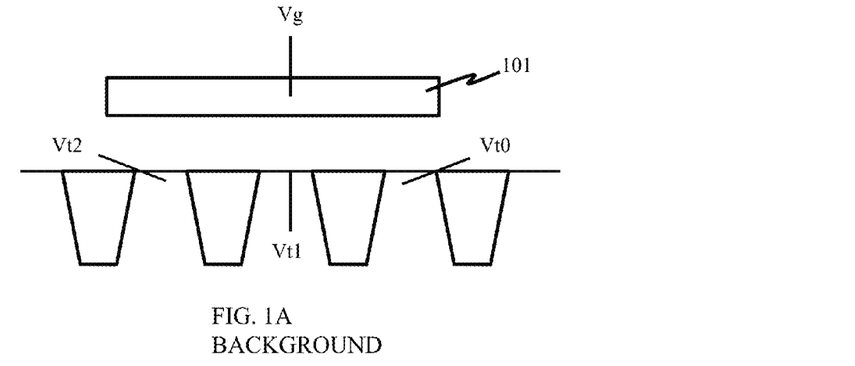
FIGS. 1A and 1B schematically illustrate a conventional multi-value logic transistor structure.
Figure 1B:
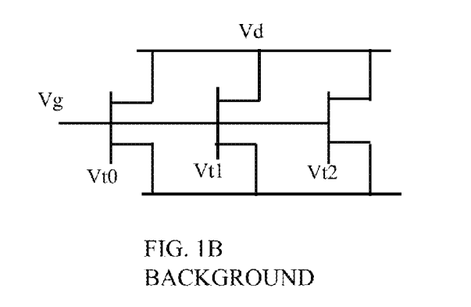
Figure 1C:
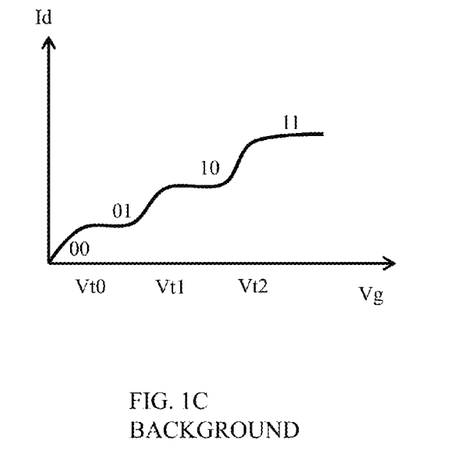
FIG. 1C shows the output current for each $V_t$ value.

Conventional structures of transistors which can process multiple logic states are typically formed, as illustrated in FIGS. 1A and 1B, by transistors with multiple threshold voltages (e.g., $V_{t0}$, $V_{t1}$, and $V_{t2}$) and a shared common gate electrode 101. Therefore, an N-state transistor is practically composed of N transistors sharing a common gate (i.e., having a footprint of N transistors). As illustrated in FIG. 1C, the structure of FIGS. 1A and 1B processes four levels of logic signal (or 2 bits), 00, 01, 10, and 11, with the 2-bits of information at input $V_g$ represented by the 2-bits information in the output current ($I_d$). The footprint of each 2 bit logic transistor is actually three times that of a single binary logic transistor, though multi-value logic is much more efficient and faster than current binary logic. Furthermore, the fabrication method to form multi-$V_t$ for each transistor is complicated and costly.

A need therefore exists for methodology enabling formation of multi-value logic transistor structures with a small footprint and the resulting device.

SUMMARY

An aspect of the present disclosure is a multi-valued logic transistor with a footprint of a single fin.

Another aspect of the present disclosure is a method of forming a multi-valued logic transistor with a footprint of a single fin.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming plural fins on a silicon substrate, each fin covered with a hardmask; filling spaces between the fins and hardmasks with an oxide; removing the hardmasks and recessing each fin, forming a cavity in the oxide over each fin; forming plural silicon-based (Si-based) layers in each cavity with an increasing percentage of germanium (Ge) or carbon (C) content or with an increasing concentration of dopant from a bottom layer to a top layer; recessing the oxide to a depth slightly (about 5 nm) below a top portion of the fin having a thickness equal to a thickness of each Si-based layer; and forming a high-k gate dielectric and metal gate electrode over the plural Si-based layers.

Aspects of the present disclosure include recessing the fins removing the hardmask from the fins with hot phosphorus and recessing the fins by plasma Si etching. A further aspect includes forming each cavity to a depth of 40 nanometers (nm), wherein each cavity has an aspect ratio of 5:1 or less. An additional aspect includes forming each Si-based layer to a thickness of 10 to 15 nm. Another aspect includes forming the Si-based layers sequentially by epitaxial growth. Other aspects include forming the layers by selective epi growth (SEG) of silicon germanium (SiGe) with an increasing percentage of Ge. Further aspects include the percentage of Ge ranging from 0 to 50%. Another aspect includes forming the Si-based layers by SEG of carbon-doped silicon (Si:C) with an increasing percentage of C. Other aspects include the percentage of C ranging from 0 to 2%. An additional aspect includes forming the Si-based layers by SEG with in situ doping an increasing concentration of dopant (e.g., boron (B) for p-type and phosphorus (P) or arsenic (As) for n-type dopants). A further aspect includes the concentration of dopant ranging from 1E18 to 1E20.

Another aspect of the present disclosure is a device including: plural fins on a silicon substrate; an oxide filling spaces between the fins; each fin having plural Si-based layers stacked up with an increasing percentage of Ge or C and/or with an decreasing concentration of dopant from a bottom layer to a top layer; and a high-k dielectric and metal gate electrode over the plural Si-based layers, with a Vt of each layer progressively decreasing from the bottom layer. Thus, there are multiple Vt's built in each FinFET.

Aspects of the present disclosure include each Si-based layer having a thickness of 10 to 15 nm. Further aspects include the layers including selective epi growth (SEG) SiGe with an increasing percentage of Ge. Other aspects include the percentage of Ge ranging from 0 to 50%. Another aspect includes the layers including SEG Si:C with an increasing percentage of C. An additional aspect includes the percentage of C ranging from 0 to 2%. A further aspect includes the layers including SEG in situ doped Si with a decreasing concentration of dopant. Other aspects include the concentration of dopant ranging from 1E18 to 1E20.

Another aspect of the present disclosure is a method including: forming plural fins on a silicon substrate, each fin covered with a hardmask; filling spaces between the fins and hardmasks with an oxide; planarizing the oxide; removing the hardmasks and recessing each fin with hot phosphorus, forming a cavity to a depth of 40 nm in the oxide over each fin; masking cavities over fins for p-FinFETs, exposing fins for n-FinFETS; epitaxially growing plural Si-based layers in each cavity with a percentage of C increasing between 0 and 2% or with a concentration of p-type dopant decreasing between 1E18 and 1E20 from a bottom layer to a top layer; masking cavities over fins for n-FinFETs, exposing fins for p-FinFETS; epitaxially growing plural Si-based layers in each cavity with a percentage of Ge increasing between 0 and 50% or with a concentration of n-type dopant decreasing between 1E18 and 1E20 from a bottom layer to a top layer; performing CMP for planarization to a top of the fins; recessing the oxide to a depth slightly (about 5 nm) below a top portion of the fins having a thickness equal to a thickness of each Si-based layer, and forming a high-k dielectric and metal gate electrode over the plural Si-based layers and wrapped around the fins.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure.

Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of a large footprint attendant upon forming a multi-valued logic transistor. In accordance with embodiments of the present disclosure, multiple threshold voltages (Vt) are obtained by forming multi-layered fins with an increasing percentage of Ge or C and/or a decreasing concentration of dopant from a bottom layer to a top layer, so that the Vt of each fin layer decreases progressively from the bottom layer to the top layer and a multi-valued Vt is therefore built-in for a FinFET even with one single fin.

Methodology in accordance with embodiments of the present disclosure includes forming plural fins on a silicon substrate, each fin covered with a hardmask, and filling the spaces between the fins and hard masks with an oxide. Next, the hardmasks (typically nitride) are removed (e.g., by hot phosphorous acid), and the fins are recessed, forming a cavity in the oxide over each fin. Plural Si-based layers are then formed in each cavity with an increasing percentage of Ge or C or with an decreasing concentration of dopant from a bottom layer to a top layer, so that the Vt of each layer decrease progressively from bottom layer. After CMP for planarization, the oxide is next recessed to a depth slightly lower than a top portion of the fin having a thickness equal to a thickness of each Si-based layer, and a high-k dielectric and metal gate electrode is formed over the plural Si-based layers.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
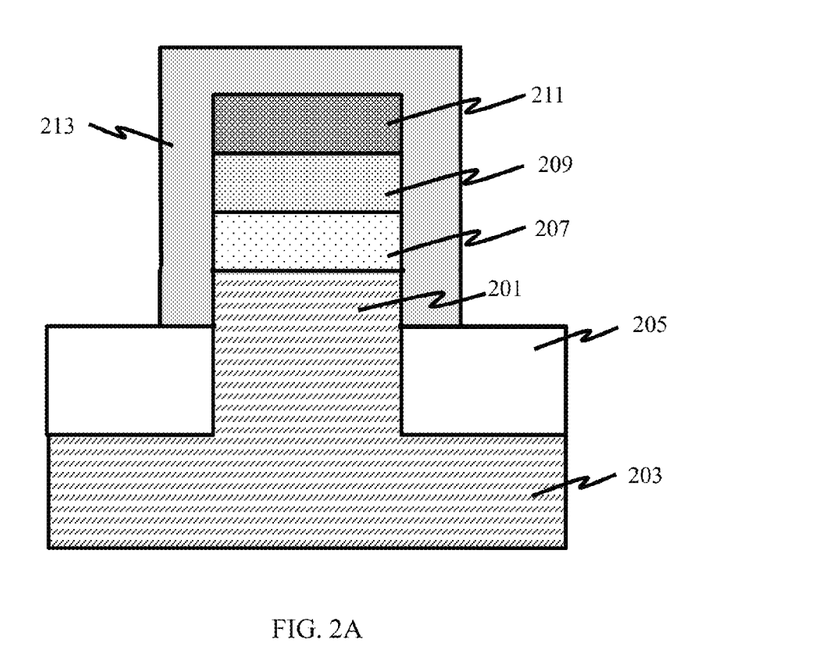
FIGS. 2A and 2B schematically illustrate cross-sectional and 3-dimensional views, respectively, of a multi-valued logic transistor, in accordance with an exemplary embodiment.
Figure 2B:
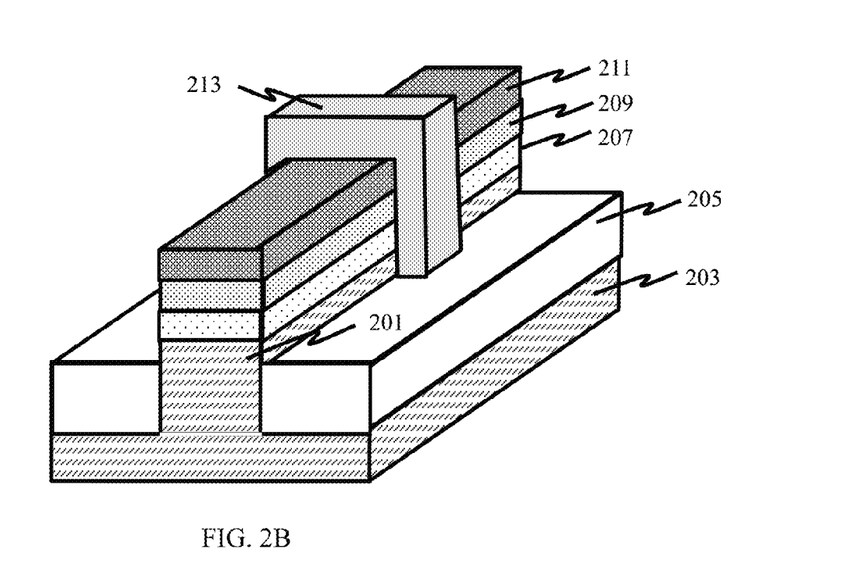

Adverting to FIGS. 2A and 2B, cross-sectional and 3D views, respectively, of a FinFET with a multi-layer fin are illustrated, in accordance with an exemplary embodiment. As shown, a silicon fin, with bottom portion 201, extends vertically from a silicon substrate 203. An oxide layer 205 is formed adjacent to and coplanar with fin bottom portion 201. Multiple fin layers 207, 209, and 211 of silicon with increasing percentages of Ge or C, and/or decreasing concentrations of a dopant for the purpose of adjusting the threshold voltage (Vt) of each layer, from the bottom layer to the top layer, are formed on fin bottom portion 201. The relationship between the Ge or C percentages, with the values being at evenly spaced intervals, minimizes the strain in each layer from the substrate 203. Similarly, the dopant concentrations can also be substantially uniform at evenly spaced intervals. If necessary, the percentage of Ge or C may be reduced again in upper layers. A metal gate electrode 213 is formed over the silicon fin (wrapping-around the fin and extending to a depth slightly (i.e. about 5 nm) below a top portion of the fin having a thickness equal to a thickness of each Si-based layer), with an intervening high-k gate dielectric layer (not shown for illustrative convenience). Although four fin layers (including bottom layer 201) are shown in FIGS. 2A and 2B, for two bits, more layers may be formed for more additional bits. In addition, the percentage of Ge or C may vary continuously for analog signals.

In FIGS. 2A and 2B, for a P-FinFET, layers 207 through 211 may be formed of SiGe. The SiGe may be $SiGe_{0.15}$, $SiGe_{0.30}$, and $SiGe_{0.45}$, respectively, for layers 207, 209, and 211, for three threshold voltages, $V_{t0}$, $V_{t1}$, and $V_{t2}$. The progressively higher Ge percentage in the SiGe channels toward the top results in a valence band edge being progressively shifted (toward mid-gap); as a result, the Vt of the p-FinFET decreases the amount of band-gap edge shifted, respectively, and Vt is shifted toward a lower magnitude (i.e. $V_{t0} > V_{t1} > V_{t2}$ in magnitudes). The Ge containing Si layer (or SiGe) is preferred for p-FinFET due to its compressive stress in a SiGe film, resulting in higher hole mobility (than pure Si layer).

Figure 3A:
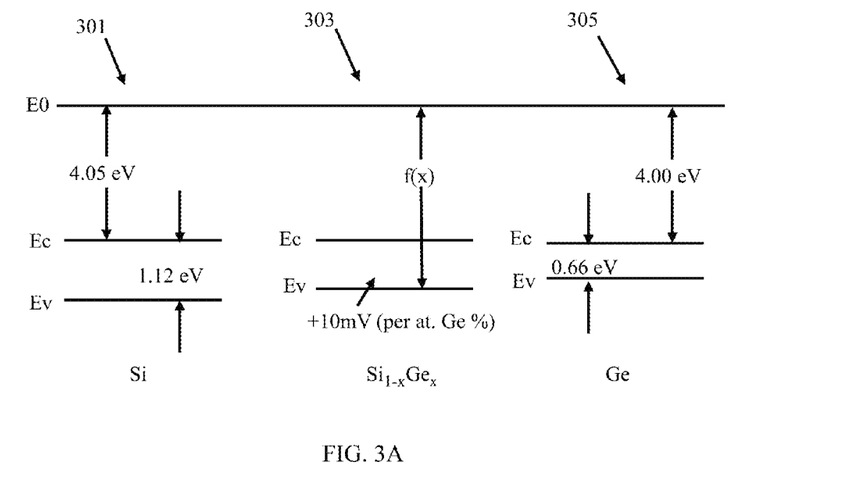
FIG. 3A schematically illustrates energy-band levels in Si, SiGe, and Ge and FIG. 3B schematically illustrates energy-band levels in Si, Si—Ge—C, and Si:C.

Energy-band levels in Si, SiGe, and Ge are shown at 301, 303, and 305, respectively, in FIG. 3A. The band-gap of SiGe is smaller than Si mainly due to the valence band edge shift (about 10 millivolt (mV) per atomic (at.) percent of Ge) toward the mid-band (but negligible conduction band shift). Thus, for a p-FinFET design, the multi-layers of SiGe in the fin can maintain non-doping with progressively higher percentages of Ge toward the top, so that the valence band edge is progressively shifted (toward mid-gap) and the p-Vt is shifted toward lower magnitudes. As an added advantage, the p-FinFET has a fully depleted channel (during operations) as well as a compressively strained channel with enhanced hole mobility.

In FIGS. 2A and 2B, for an n-FinFET, layers 207 through 211 may be formed of Si:C. The Si:C may be Si, $Si:C_{1\%}$, and $Si:C_{2\%}$, respectively, for layers 207, 209, and 211, for three threshold voltages, $V_{t0}$, $V_{t1}$, and $V_{t2}$. The progressively higher C percentage in the Si channels toward the top results in a conduction band edge being progressively shifted (toward mid-gap); as a result, the Vt of the p-FinFET (or n-FinFET) decreases the amount of band-gap edge shifted, respectively, and Vt is shifted toward a lower magnitude (i.e. $V_{t0} > V_{t1} > V_{t2}$ in magnitudes). The C containing layer is preferred for n-Fin- FET due to its tensile stress in film and resulting in higher electron mobility (than pure Si layer).

Figure 3B:
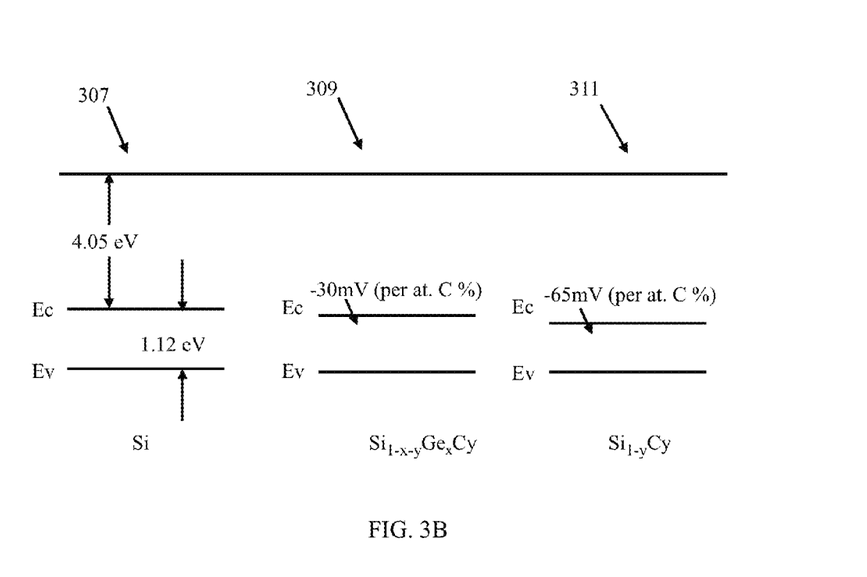

Energy-band levels in Si, Si—Ge—C, and Si:C are shown at 307, 309, and 311, respectively, in FIG. 3B. The C doping in Si mainly results in a conduction band edge shift (about 30 mV per at. percent of C) toward the mid-band. Thus, for an n-FinFET design, the multi-layers of Si:C in the fin can maintain non-doping with progressively higher percentages of C toward the top, so that the conduction band edge is progressively shifted (toward mid-gap) and the n-Vt is shifted toward lower magnitudes. As an added advantage, the n-FinFET has a fully depleted channel (during operations) as well as a tensile strained channel with enhanced electron mobility.

Layers 207 through 211 in FIGS. 2A and 2B may alternatively be doped Si, with progressively lower doping concentrations from layer 207 to layer 211 for three threshold voltages, $V_{t0}$, $V_{t1}$, and $V_{t2}$, respectively. For an n-FinFET, the layers have a p-type dopant (e.g., boron (B)), and for a p-FinFET, the layers have an n-type dopant (e.g., phosphorus (P), arsenic (As), or antimony (Sb)). The lower doping concentrations may be in the range of 1E18 to 1E20 to tune the Vt smaller in magnitude in a useful range of 0.1 to 0.5 volts (V). When the layers are doped, strain engineering can be provided during a later step of the FinFET fabrication in which an epi-stressor is grown at the source/drain regions. The higher doping at the bottom layer has the advantages of serving as "punch-through" isolation to suppress the punch-through leakage between the drain and source at minimum gate length. In this disclosure, the ability of Vt adjustment is achieved by either or both of the effects of Ge or C content and dopant concentration. Further, the doping may increase from the bottom layer towards the top layer, or a pattern of Ge or C content or of doping concentration may be created and/or repeated for specific purposes, for example for an analog gate bias or if a non-linear output (drain current) is desired.

Figure 4A:
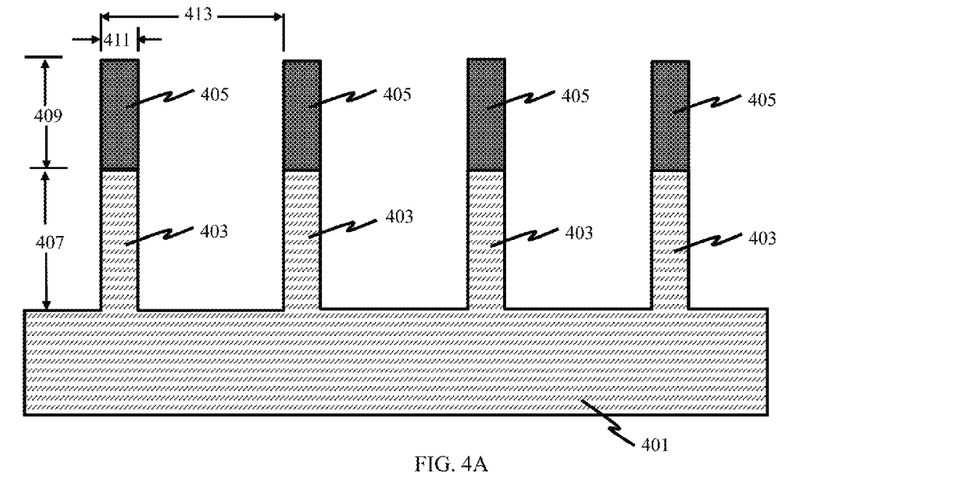
FIGS. 4A through 4F schematically illustrate a process flow for forming a multi-valued logic transistor, in accordance with an exemplary embodiment.

Adverting to FIGS. 4A through 4F, process steps for forming the FinFET of FIGS. 2A and 2B with a multi-layer fin are illustrated. As shown in FIG. 4A, a silicon substrate 401 is etched to form fins 403. The substrate may be silicon-on-insulator (SOI) or bulk (100) silicon with <110> or <100> direction (a 45° rotation from <110>). The substrate is etched by conventional mandrel and spacer pitch doubling methods. For example, a hardmask (not shown for illustrative convenience) may be deposited on the substrate and patterned to form mandrels. Next, spacers may be formed on the sides of the mandrels, and the mandrels may be removed. The spacers, which may be formed of silicon nitride ($Si_3N_4$), may then be used as a hardmask 405 for etching the silicon substrate to form the fins. The fins may be formed to a height 407 of less than 40 nm, and the spacers forming mask 405 may have a height 409 of about 30 nm. The width 411 of the fins may be about 7 nm, and the pitch 413 of the fins may be 28 to 40 nm.

Figure 4B:
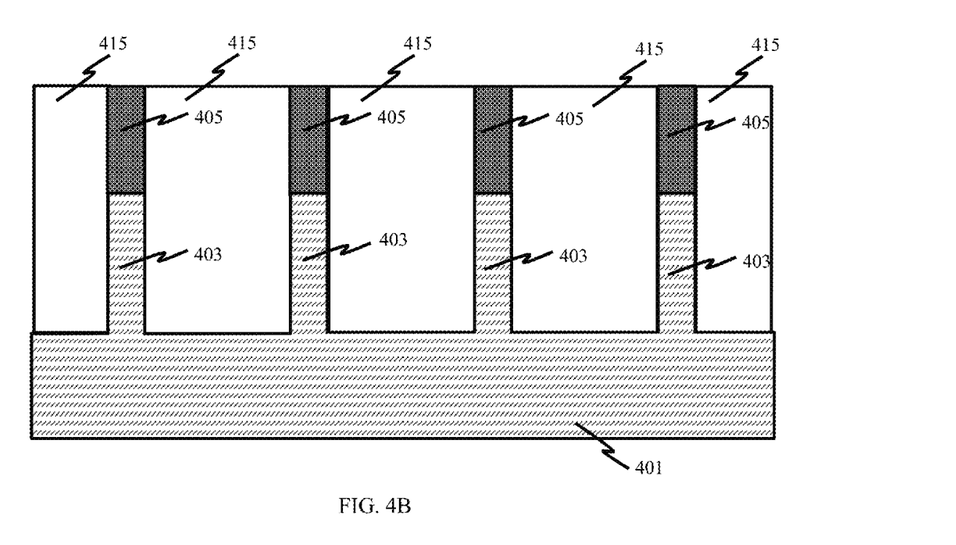

As illustrated in FIG. 4B, the trenches formed between fins 403 and hardmask 405 are filled with an oxide 415. The oxide may be, for example, silicon oxide ($SiO_2$). Oxide 515 is then planarized, for example by chemical mechanical polishing (CMP), stopping on the hardmask 405.

Figure 4C:
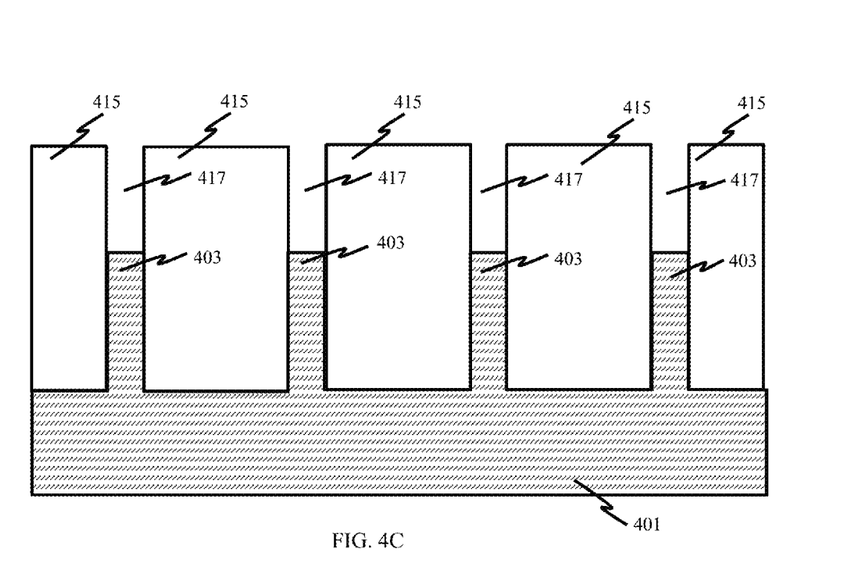

Next, hardmask 405 is removed by hot phosphorus, and the fins are recessed, forming cavities 417, as illustrated in FIG. 4C. The cavities are recessed to a depth of about 40 nm and have a width of 7 nm. In other words, the cavities are formed to have an aspect ratio of about 5:1 for manufacturability.

Figure 4D:
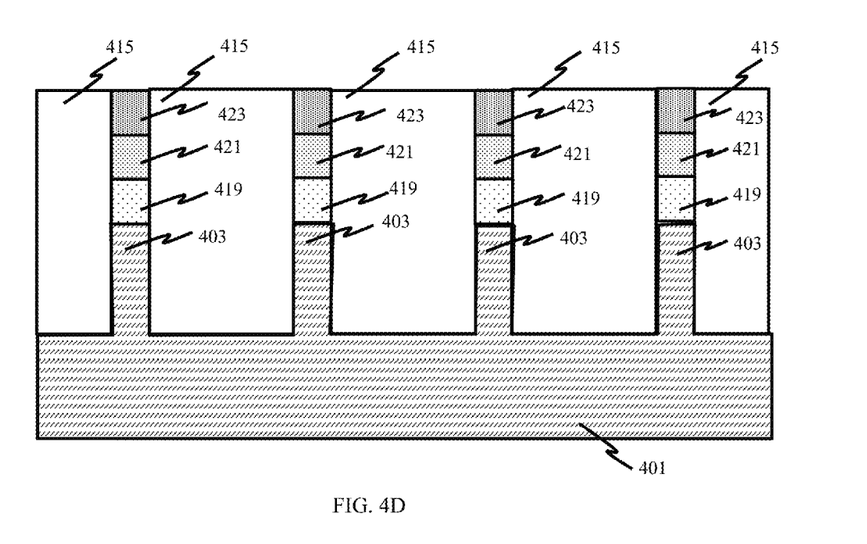

Adverting to FIG. 4D, multiple layers 419, 421, and 423 are selectively epitaxially grown in cavities 417. Each layer may be formed to a thickness of 10 to 15 nm and a width of 7 nm. Although three layers are shown (for a 2 bit device), more layers may be included for more bits, for which the layers may then be formed to a thickness of 5 to 10 nm. Process parameters during the epitaxial growth of gas flow, pressure, temperature, can be tuned for high quality Si-based film formation with minimum defects. For example, the gas flow may include silane ($SiH_4$), dichlorosilane ($Si_2Cl_2$), or hydrogen ($H_2$), pressure may range from 1 to 200 Torr, and the temperature may range from 300° to 1000° C. Fins for n-type and p-type FinFETs may be separately optimized by adding extra masking steps (not shown for illustrative convenience) for epitaxial growth only on exposed areas of Si.

For a p-FinFET, layers 419, 421, and 423 may be formed of epitaxially grown SiGe. The SiGe may be $SiGe_{0.15}$, $SiGe_{0.30}$, and $SiGe_{0.45}$, respectively, for layers 419, 421, and 423, for three threshold voltages, $V_{t0}$, $V_{t1}$, and $V_{t2}$. For an n-FinFET, layers 419, 421, and 423 may be formed of epitaxially grown Si:C. The Si:C may be Si, $Si:C_{1\%}$, and $Si:C_{2\%}$, respectively, for layers 419, 421, and 423, for three threshold voltages, $V_{t0}$, $V_{t1}$, and $V_{t2}$. The percentages of Ge or C may alternatively vary continuously from the bottom layer to the top layer to handle analog signals.

Layers 419, 421, and 423 may alternatively be doped Si, with progressively lower doping concentrations from layer 419, 421, and 423 for three threshold voltages, $V_{t0}$, $V_{t1}$, and $V_{t2}$, respectively. For an n-FinFET, the layers have a p-type dopant (e.g., B), and for a p-FinFET, the layers have an n-type dopant (e.g., P, As, or Sb). The doping concentrations are in the range of 1E18 to 1E20, so that Vt is tuned in a useful range of 0.1 to 0.5 V. Further, the epitaxial growth for Si, SiGe, Si:C, and in situ doping can all be performed in one chamber. Note the Vt adjustment can be achieved by either or both adjustment of Ge or C content as well as the dopant concentration. Also, a Vt adjustment may be achieved by progressively increasing the dopant concentration from the bottom layer to the top layer, or a pattern of Ge or C content or of doping concentration may be created and/or repeated for specific purposes, for example for an analog gate bias or if a non-linear output (drain current) is desired.

Figure 4E:
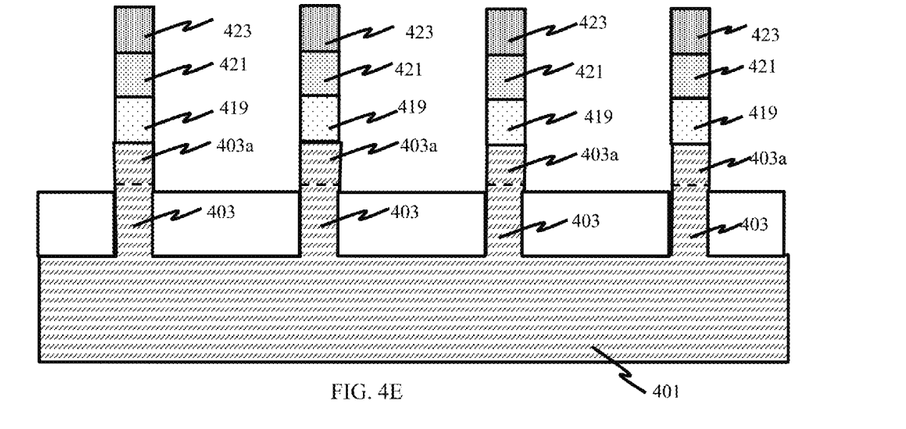
Figure 4F:
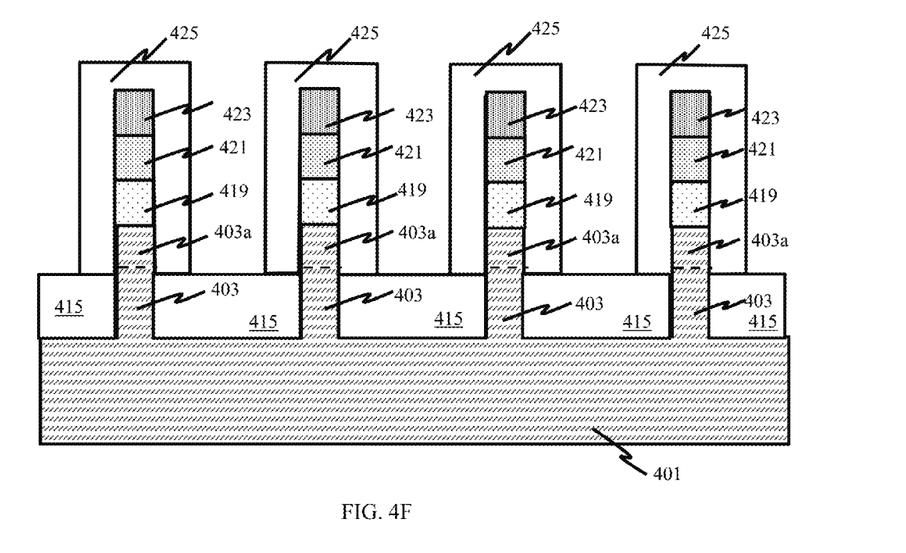

After the layers 419, 421, and 423 are formed, they are planarized by CMP, and oxide 415 is recessed down to a depth slightly below (i.e. 5 nm below) the bottom of portion 403a of fin 403 (portion 403a having the same thickness as each of layers 419, 421, and 423), as illustrated in FIG. 4E. A conventional plasma dry etch may be employed to recess the oxide, with the depth controlled by a timed etch. Adverting to FIG. 4F, a high-k dielectric (not shown for illustrative convenience) and gate electrode may then be formed over and wrapped-around the layers 419, 421, 423, and 403 for each fin.

The embodiments of the present disclosure can achieve several technical effects, such as multi-valued logic transistors with a small footprint of a single fin, the thickness and percentage of Ge or C and/or the concentration of dopant can be progressively varied to set the multiple layers, n-type and p-type fins can be separately optimized by epitaxial growth of different materials and stress levels for high performance and low leakage, and FinFETs for multi-valued logic and binary logic can be formed together on the same chip. The present disclosure enjoys industrial applicability in any of highly integrated MVL semiconductor devices, including an analog device, a decoder of analog signals, or a sensor of analog non-volatile memory.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming plural fins on a silicon substrate, each fin covered with a hardmask;
   filling spaces between the fins and hard masks with an oxide;
   removing the hardmasks and recessing each fin, forming a cavity in the oxide over each fin;
   forming plural silicon-based (Si-based) layers in each cavity with an increasing percentage of germanium (Ge) or carbon (C) content or with an increasing concentration of dopant from a bottom layer to a top layer;
   performing CMP for planarization to a top of the fins;
   recessing the oxide to a depth slightly below a top portion of the fins having a thickness equal to a thickness of each Si-based layer; and
   forming a high-k gate dielectric and metal gate electrode over the plural Si-based layers.

2. The method according to claim 1, comprising removing the hardmask from the fins with hot phosphorus and recessing the fins by plasma Si etching.

3. The method according to claim 2, comprising forming each cavity to a depth of 40 nanometers (nm), wherein each cavity has an aspect ratio of 5:1 or less.

4. The method according to claim 1, comprising forming each layer to a thickness of 10 to 15 nm.

5. The method according to claim 1, comprising forming the layers sequentially by epitaxial growth.

6. The method according to claim 5, comprising forming the layers by selective epi growth (SEG) of silicon germanium (SiGe) with an increasing percentage of Ge.

7. The method according to claim 6, wherein the percentage of Ge ranges from 0 to 50%.

8. The method according to claim 5, forming the layers by SEG of carbon-doping silicon (Si:C) with an increasing percentage of C.

9. The method according to claim 8, wherein the percentage of C ranges from 0 to 2%.

10. The method according to claim 5, comprising forming the layers by SEG with in situ doped silicon (Si) with a decreasing concentration of dopant.

11. The method according to claim 10, wherein the concentration of dopant ranges from 1E18 to 1E20.

12. A method comprising:
    forming plural fins on a silicon substrate, each fin covered with a hardmask;
    filling spaces between the fins and hardmasks with an oxide;
    planarizing the oxide;
    removing the hardmasks and recessing each fin with hot phosphorus, forming a cavity to a depth of 40 nanometers (nm) in the oxide over each fin;
    masking cavities over fins for p-FinFETs, exposing fins for n-FinFETS;
    epitaxially growing plural silicon-based (Si-based) layers in each cavity with a percentage of carbon (C) increasing between 0 and 2% or with a concentration of p-type dopant decreasing between 1E18 and 1E20 from a bottom layer to a top layer;
    masking cavities over fins for n-FinFETs, exposing fins for p-FinFETS;
    epitaxially growing plural Si-based layers in each cavity with a percentage of germanium (Ge) increasing between 0 and 50% or with a concentration of n-type dopant decreasing between 1E18 and 1E20 from a bottom layer to a top layer;
    recessing the oxide to a top of the fins to a depth slightly below a top portion of the fin having a thickness equal to a thickness of each Si-based layer; and
    forming a high-k gate dielectric and metal gate electrode over the plural Si-based layers and wrapped around the fins.

* * * * *